United States Patent [19]

Nakao et al.

[11] Patent Number: 5,187,857
[45] Date of Patent: Feb. 23, 1993

[54] APPARATUS FOR MANUFACTURING ELECTRONIC PARTS WRAPPED WITH CONDUCTIVE FOIL

[75] Inventors: Akira Nakao, Nara; Toyofusa Endo, Takarazuka; Takeshi Ikeda, Tokyo, all of Japan

[73] Assignees: Hitachi Zosen Corporation, Osaka; Takeshi Ikeda, Tokyo, both of Japan

[21] Appl. No.: 859,584

[22] Filed: Mar. 27, 1992

[30] Foreign Application Priority Data

Mar. 29, 1991 [JP] Japan .................................. 3-65821

[51] Int. Cl.⁵ .............................................. H01G 13/00
[52] U.S. Cl. .................................. 29/564.7; 29/25.42
[58] Field of Search ................ 29/564.7, 564.6, 566.3, 29/564.8, 729, 759, 854, 827, 832, 25.42, 25.41, 563, 564, 33 P; 242/56.1, 56.9

[56] References Cited

U.S. PATENT DOCUMENTS

| 3,073,007 | 1/1963 | Rubinstein et al. | 29/564.7 X |
| 4,630,784 | 12/1986 | Roy | 242/56.1 |
| 4,662,066 | 5/1987 | Toman et al. | 29/564.6 X |

FOREIGN PATENT DOCUMENTS

| 2839245 | 4/1979 | Fed. Rep. of Germany | 29/25.42 |
| 1252842 | 8/1986 | U.S.S.R. | 29/25.42 |
| 700311 | 11/1953 | United Kingdom | 29/25.42 |

Primary Examiner—William Briggs
Attorney, Agent, or Firm—Barnes, Kisselle, Raisch, Choate, Whittemore & Hulbert

[57] ABSTRACT

The invention provides a novel apparatus for manufacturing electronic parts each incorporating a plurality of lead wires fully wrapped with conductive foil like noise filters for example. A turn table is intermittently shifted from the first work station to the seventh work station in the state in which an individual-unit lead-wire member is retained by a holding unit on the turn table. A predetermined lead wire is folded by respective work stations, whereas the remaining lead wires are adhered with conductive foil tapes via spot-welding process, and then these lead wires are fully wrapped with conductive foil tapes. Next, the predetermined lead wire is restored to the initial posture, and then all the lead wires are fully wrapped with insulation tapes. In this way, all the lead wires are properly processed so that they can be integrated in perfect alignment with constant pitches.

4 Claims, 11 Drawing Sheets

APPARATUS FOR MANUFACTURING ELECTRONIC PARTS WRAPPED WITH CONDUCTIVE FOIL

FIELD OF THE INVENTION

The present invention relates to an apparatus which is available for manufacturing electronic parts wrapped with conductive foil.

BACKGROUND OF THE INVENTION

Conventionally, on the way of manufacturing insertable electronic parts, electric wires available for composing lead wires are sequentially wound in the state being welded to conductive foil. These foil-wrapped lead wires are eventually finished in circular shape and respectively disposed on circumference. Then, the rounded composition is crushed into flat configuration.

Nevertheless, since the conventional method crushes the rounded composition of lead wires into flat configuration, potentially, pitch of the plane lead wires may not always be aligned constant.

DISCLOSURE OF THE INVENTION

Therefore, the object of the invention is to provide a novel apparatus for manufacturing electronic parts wrapped with conductive foil. Characteristically, the apparatus embodied by the invention manufactures specific electronic parts by applying a lead frame in order that lead wires can always be aligned at constant pitch.

To achieve the above object, according to the first aspect of the invention, a novel apparatus is hereby provided, which uses a lead frame being furnished with three lead wires aligned in parallel with each other and yet containing a number of continuously provided individual-unit lead-wire members, wherein each of these lead-wire members contains a specific lead wire that branches out a lead wire. The apparatus embodied by the invention is specifically available for manufacturing electronic parts by wrapping an end of the lead-wire member with a conductive foil tape having one surface or both surfaces of the conductive foil being coated with insulation tape. The apparatus embodied by the invention characteristically comprises the following;

a holding unit which freely holds and releases the other end of said lead-wire member and is rotatable by means of a rotating unit;

means for intermittently shifting said holding unit along a plurality of work stations respectively executing predetermined functional operations;

a bending unit which is provided for the first work station in order to bend a lead wire branched out from said lead-wire member cut off by a cutting unit provided for the first work station;

a connection unit which is provided for the following work station in order to conductively connect a first conductive foil tape drawn out of a reel to a predetermined lead wire of said lead-wire member; and a cutting unit which cuts off the conductive foil tape at a predetermined position;

another connection unit which is provided for the following work station in order to conductively connect a second conductive foil tape drawn out of a reel to another lead wire other than the one conductively being connected by the second work station; and a cutting unit which cuts off the conductive foil tape at a predetermined position;

a correction unit which is provided for the following work station in order to straighten an extra lead wire being branched out from said lead-wire member having an end being wrapped with the first and second conductive foil tapes by effect of the rotation of the holding unit; and another connection unit which conductively connects a conductive foil tape conductively being jointed with a lead wire to the branched lead wire;

a pressing unit which is provided for the following work station in order to press the above-identified lead-wire member having an end being wrapped with an insulation tape by effect of the rotation of the holding unit; and a cutting unit which cuts off the insulation tape into a predetermined length; and a delivery unit which is provided for the following work station in order to receive said lead-wire member from the holding unit and eventually delivering it to the following process line.

According to the second aspect of the invention, using a lead frame which continuously accommodates a number of individual-unit lead-wire members respectively being provided with three lead wires in parallel with each other, the apparatus embodied by the invention manufactures electronic parts by wrapping an end of the above-identified lead-wire member with a conductive foil tape whose one surface is or both surfaces are coated with insulation film, wherein the apparatus according to the second aspect of the invention comprises the following;

a holding unit which freely holds and releases the other end of said lead-wire member and is rotatable by means of a rotating unit;

a means for intermittently shifting the holding unit along a plurality of work stations respectively executing predetermined functional operations;

a bending unit which is provided for the first work station in order to bend an external lead wire of said lead-wire member previously being cut off by a cutting unit provided for the first work station;

a connection unit which is provided for the following work station in order to conductively connect the first conductive foil tape drawn out of a reel to a predetermined lead wire of said lead-wire member; and a cutting unit which cuts off the conductive foil tape at a predetermined position;

another connection unit which is provided for the following work station in order to connect a second conductive foil tape to a lead wire other than the one conductively being connected by the second work station; and a cutting unit which cuts off the conductive foil tape;

a correction unit which is provided for the following work station in order to straighten the external lead wire of said lead-wire member having an end being wrapped with the first and second conductive foil tapes by effect of the rotation of the holding unit; and another connection unit which conductively connects the conductive foil tape jointed with a lead wire to the straightened external lead wire;

a pressing unit which is provided for the following work station in order to press said lead-wire member having an end being wrapped with an insulation tape by effect of the rotation of the holding unit; and a cutting unit which cuts off the insulation tape into a predetermined length; and a delivery unit which is provided for the following work station in order to receive said lead-wire member from the holding unit and eventually delivering it to the following process line.

Next, functional steps for manufacturing electronic parts using the apparatus according to the first aspect of the invention are sequentially described below.

Initially, the first work station activates operation, in which a lead wire branched out from an individual-unit lead wire member is bent by 90° by means of a bending unit.

Next, the second work station is activated, in which the first conductive foil tape drawn out of a reel is conductively connected to a predetermined lead wire of the aboveidentified lead-wire member, and then the first conductive foil tape is cut into a predetermined length by a cutting unit.

Next, the third work station is activated, in which, as was done by the second work station, the second conductive foil tape is conductively connected to another lead wire of the above-identified lead-wire member, and then the second conductive foil tape is cut into a predetermined length by a cutting unit.

Next, the fourth work station is activated, in which, as a result of the rotation of the holding unit, the first and second conductive foil tapes respectively wrap the whole of these lead wires, and then a correction unit straightens the branched lead wire to restore the initial horizontal posture in parallel with the remaining lead wires.

Next, an end of the second conductive foil tape conductively being connected to the lead wire on the way of operating the third work station is conductively jointed with the straightened branched lead wire.

When the following work station is activated, all the lead wires are fully wrapped and sealed with insulation tapes by several rounds and then pressed together before eventually being cut off into a predetermined length.

These work stations respectively execute predetermined functional steps to shift the substantially completed parts to the following work station. Next, the delivery unit disengages all the above-identified parts from the holding unit for delivery to a heat press for example before making up complete electronic parts.

Unlike the system according to the first aspect of the invention, the system according to the second aspect of the invention dispenses with the provision of such a lead wire branched out from the above-identified lead-wire member, but instead, of those three lead wires, an external lead wire serves as the branched lead wire.

When the first work station of the apparatus according to the second aspect of the invention is activated, an external lead wire of the above-identified lead-wire member is bent by 90° by means of the bending unit.

When the following work station is activated, the first conductive foil tape drawn out of a reel is conductively connected to a predetermined lead wire of the above-identified lead-wire member and then cut into a predetermined length by a cutting unit.

As was done by the second work station, the following station conductively connects the second conductive foil tape to another lead wire of the above-identified lead-wire member, and then the second conductive foil tape is cut into a predetermined length by a cutting unit.

Next, when the following work station is activated, as a result of the rotation of the holding unit, the first and second conductive foil tapes are respectively wound on the two remaining lead wires. Next, the correction unit straightens the external lead wire to restore the initial horizontal posture in parallel with other lead wires.

Next, an end of the second conductive foil tape conductively being connected to the lead wires by the third work station is conductively jointed with the external lead wire.

When the following work station is activated, all the lead wires are fully wrapped and sealed with insulation tapes and then pressed before being cut into a predetermined length.

These work stations respectively execute predetermined functional steps in order to shift substantially completed parts to the following station. Finally, the delivery unit disengages these parts from the holding unit for delivery to a heat press for example before making up complete electronic parts.

As was described above, using a lead frame which accommodates a number of continuous individual-unit lead-wire members each being composed of a plurality of lead wires disposed in parallel with each other, the apparatus embodied by the invention automatically joints conductive foil with ends of respective lead-wire members, thus fully wrapping them before yielding predetermined electronic parts. By virtue of this novel art, unlike the conventional practice, the apparatus embodied by the invention dispenses with such a process to crush the rounded parts. In consequence, pitch of all the lead wires built in each complete electronic part can securely be held constant, thus effectively promoting productivity.

DESCRIPTION OF THE PREFERRED EMBODIMENTS

Figure 2:
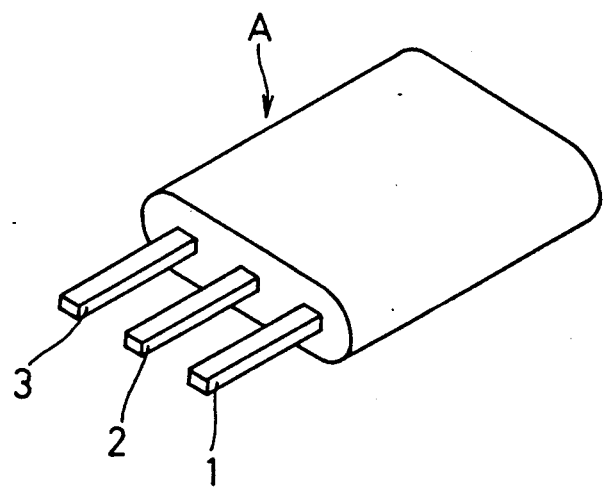
FIG. 2 is a perspective view of an electronic part manufactured by the apparatus according to an embodiment of the invention.
Figure 3:
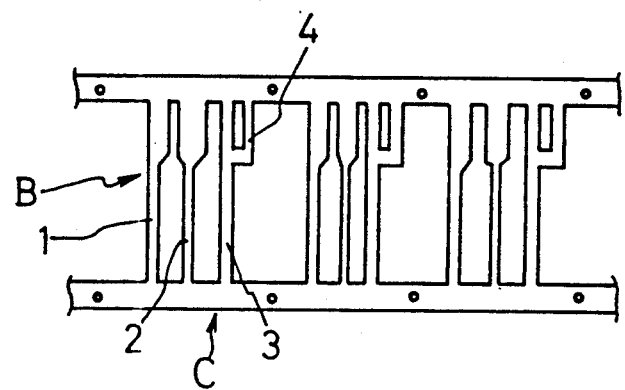
FIG. 3 is a plan of the lead frame according to an embodiment of the invention.
Figure 4:
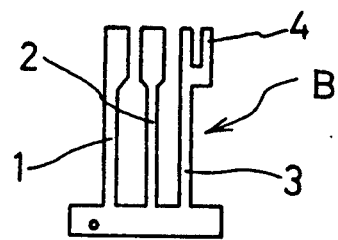
FIG. 4 is a plan of the individual-unit lead-wire member according to an embodiment of the invention.

Characteristically, the apparatus for manufacturing electronic parts wrapped with conductive foil embodied by the invention is designed and offered in order to manufacture such an electronic part A like a noise filter for example typically containing three lead wires 1 through 3 like the one shown in FIG. 2. More particularly, as shown in FIG. 3, using a lead frame C which is furnished with a number of continuous individual-unit lead-wire members B each containing three lead wires 1 through 3 (hereinafter referred to as the first pin, second pin, and the third pin) aligned in parallel with each other, and yet, being added with another lead wire 4 (hereinafter referred to as the fourth pin) branched out from a specific lead wire like the third pin for example, the apparatus embodied by the invention automatically and continuously manufactures electronic parts A.

The apparatus embodied by the invention ideally processes these electronic parts A by initially welding a conductive foil tape against a predetermined lead wire at an end of the individual-unit lead-wire member B followed by executing a process for winding the welded conductive foil tape onto this lead wire. The conductive foil tape is composed of conductive (aluminium or copper) foil having both surfaces being coated with insulation film.

Each of these electronic parts A bilaterally functions as a capacitor and a coil. For example, when inserting films between a pair of aluminium foils, a capacitor is completed. Capacity "Co" per unit length can be expressed by applying an equation (1) shown below.

$$Co = \xi o \times \xi s \times a/t \qquad (1)$$

where
$\xi o$ designates dielectric constant in vacuum ($8.855 \times 10^{-12}$);
$\xi s$ designates specific dielectric constant of film (3.1 when applying PET);
a designates width (m) of aluminium foil; and
t designates thickness (m) of film For example, when composing a capacitor composed of quadruple conductive foils, there are those values being made available, including 3 mm of the width of aluminium foil, 25 micrometers of the thickness of film, and 3.1 of the specific dielectric constant of film, and yet, there is substantially 6 mm of the length of aluminium foil. Therefore, the total capacity C is calculated as shown below.

$$C = 8.86 \times 10^{-12} \times 3.1 \times 3 \times 10^{-3} \times 6 \times 10^{-3}/2.5 \times 10^{-5}$$
$$= 1.98 \times 10^{-11} F$$

When winding up a belt-like aluminium foil, like a wound-up electric wire, a coil is generated to result in the generation of inductance L, which is expressed by an equation (2) shown below.

$$L \approx \mu 0 \times N \times h/(2a \times (1+h)) \qquad (2)$$

where
$\mu 0$ designates magnetic permeability in vacuum;
N designates the number of turns;
a designates width of aluminium foil;
H designates length of turned coil; and
h designates thickness of turned coil As is clear from the above description, when winding up a pair of aluminium foils inserted film therebetween, a capacitor is completed between these two aluminium foils, and yet, a coil is simultaneously formed at both ends of an aluminium foil.

Figure 16:
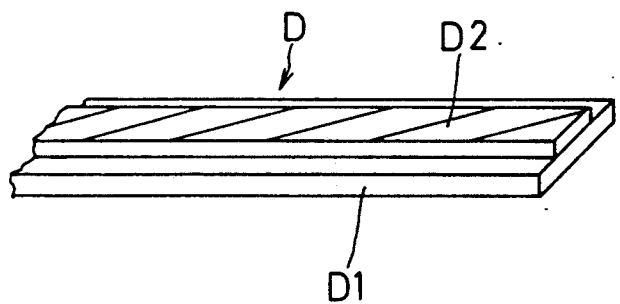
FIG. 16 is a perspective view of the conductive foil tape available for implementing the method according to an embodiment of the invention.

Next, concrete structure of conductive foil tape D made available for embodying the invention is described below. As is typically shown in FIG. 16, the conductive foil tape D comprises an insulation tape D1 made from polyethylene terephthalate resin for example having both surfaces being coated with a conductive foil D2 consisting of either aluminium foil or copper foil.

Figure 1:
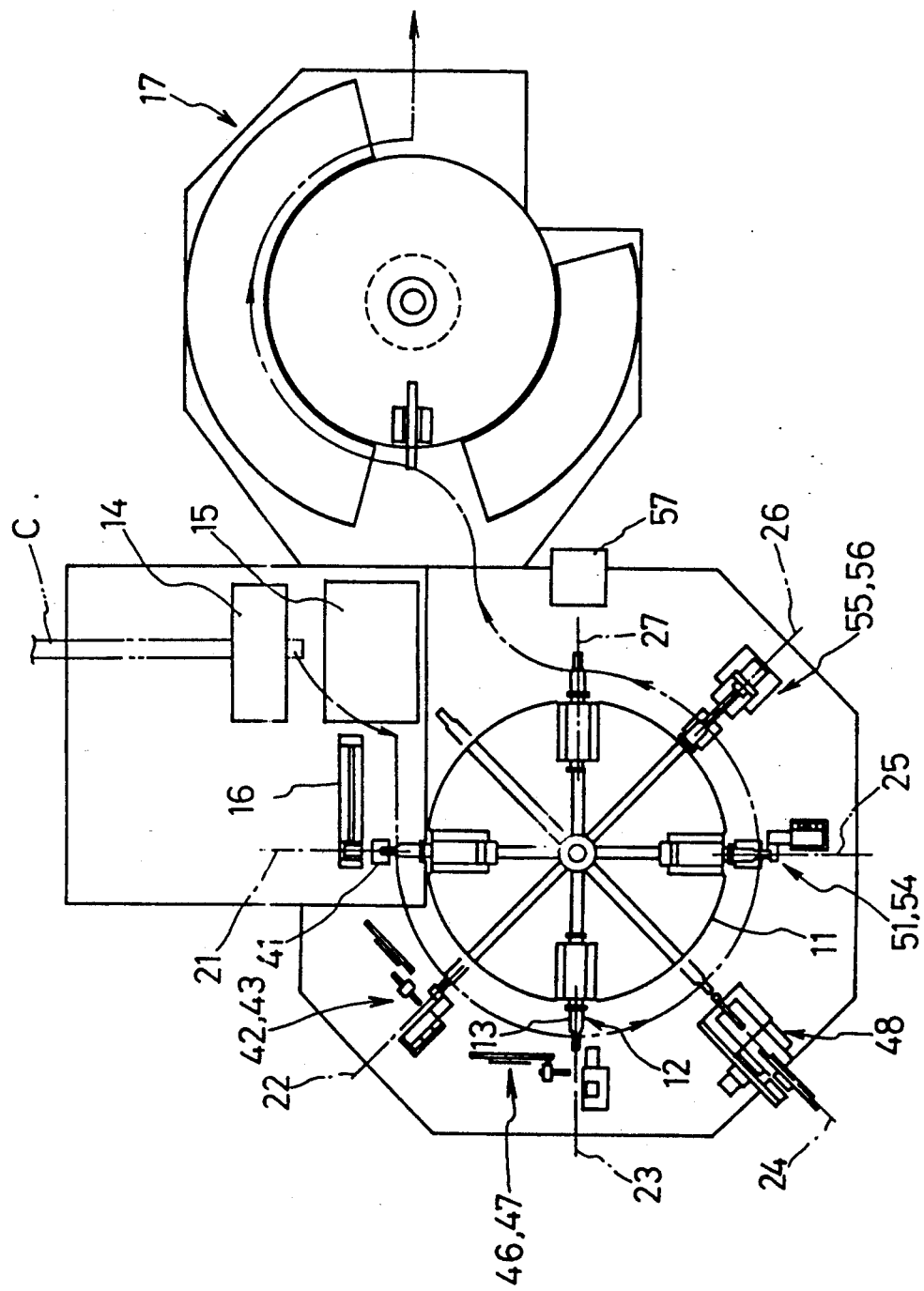
FIG. 1 is an overall plan schematically illustrating the apparatus for manufacturing electronic parts wrapped with conductive foil according to an embodiment of the invention.

Referring now to FIG. 1, schematic structure of the apparatus according to an embodiment of the invention is described below.

The reference numeral 11 shown in FIG. 1 designates a turn table. The turn table 11 has a holding unit 13 which freely holds and releases an end of each individual-unit lead-wire member (hereinafter merely called a lead-wire member) B, and the turn table 11 intermittently moves the holding unit 13, which is freely rotatable by means of a rotating unit 12, to a plurality of successive work stations each executing predetermined functional operation. A variety of functional components are in the periphery of the turn table 11, that is, a cutting unit 14 like a cutting press which cuts off a lead frame C per lead-wire member B; a delivery unit 15 and a conveying unit 16 which sequentially deliver each of the cut-off lead-wire member B shown in FIG. 14 to a holding unit 13 on the turn table 11, first through seventh work stations 21 through 27 which respectively execute predetermined functional operation against each lead-wire member B delivered to the holding unit 13 via the conveying unit 16, and a heat press 17 which thermally compresses the delivered parts made by treating with those predetermined processes by the preceding work stations 21 through 27.

Next, details of the turn table 11 and the holding unit 13 are described below. The turn table 11 is intermittently rotated by a predetermined angle via a motor, where the turn table 11 has the structure identical to that of an indexing table for example.

Figure 15:
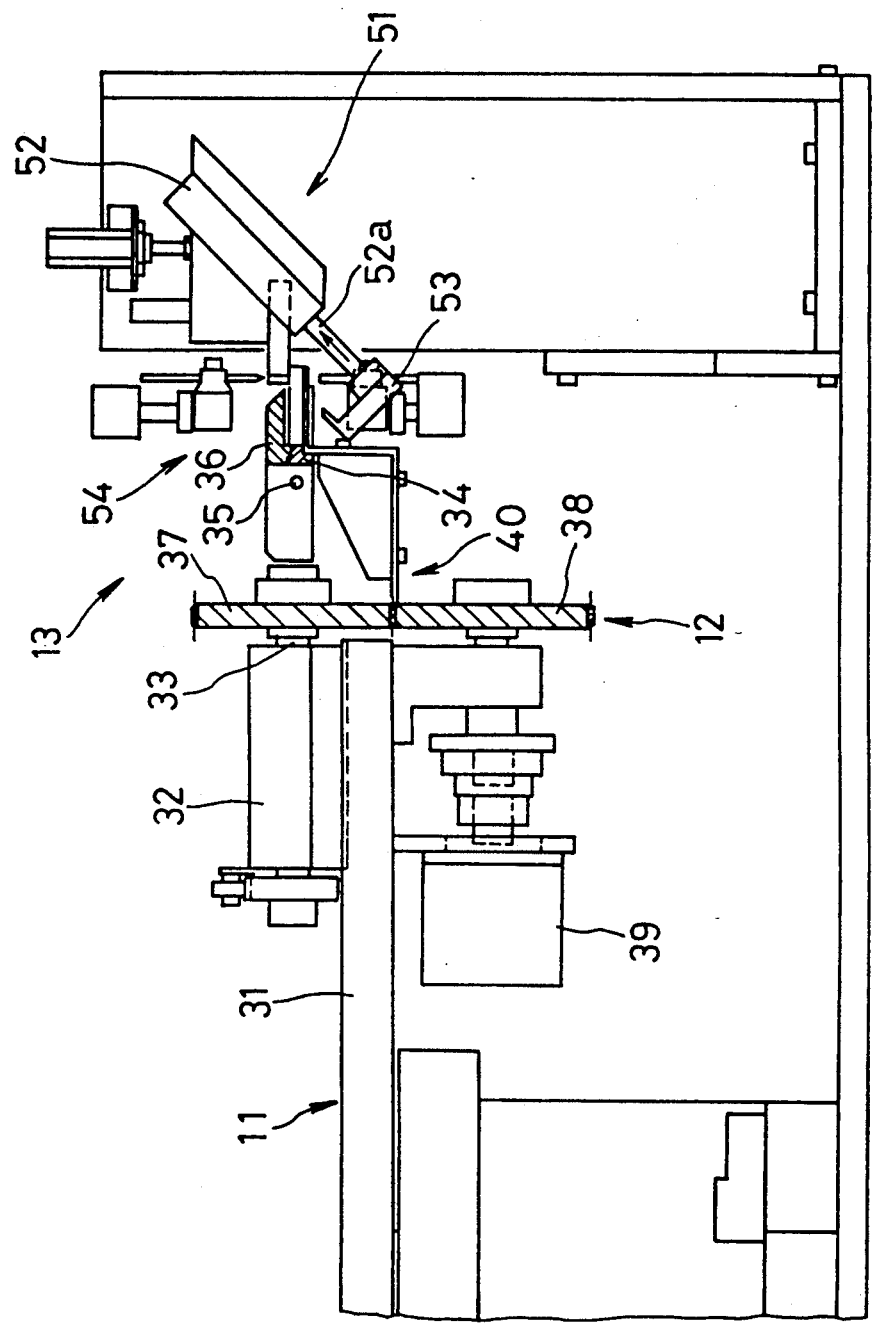
FIG. 15 is a plan of essential components of the fifth work station according to the embodiment of the invention.

As shown in FIG. 15, the holding unit 13 comprises the following; a cylindrical holder 32 which is disposed on the top surface of a table 31 of the turn table 11 in the radial direction thereof; a rotary shaft 33 rotatably supported by the cylindrical holder 32; a bottom-side holding claw 34 which is secured to the tip of the rotary shaft 33; a top-side holding claw 35 which is swingably held to the tip of the rotary shaft 33 via a supporting pin 34; a spring (not shown) which urges the top-side holding claw 35 in the direction to the bottom-side holding claw 34; and a servo motor 39 which rotates the rotary shaft 33 via a pair of gears 37 and 38. These gears 37 and 38 and the servo motor 39 integrally compose the rotating unit 12 described above.

Now, therefore, when the servo motor 39 rotates in the holding unit 13, each piece of the lead-wire member B is rotated by way of pivoting on the horizontal axis of the cylindrical holder 32 to permit a conductive foil tape to envelop the circumferential surface of the lead-wire member B.

When a depressing member installed to a predetermined position depresses an end of the top-side holding claw 35 in resistance against the force energized by the spring the lead-wire member B is released from the state of being retained by the top and bottom holding claws 35 and 34.

Figure 13:
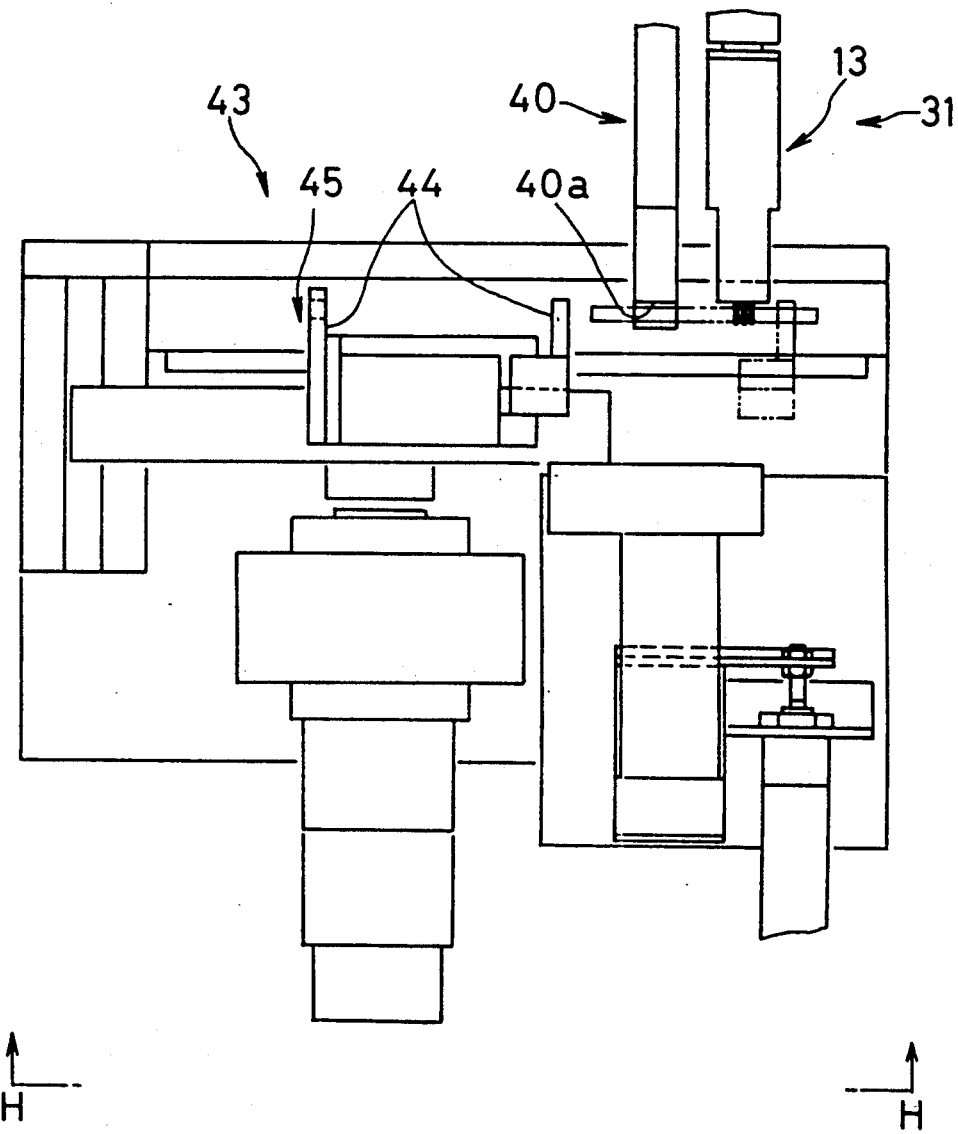
FIG. 13 is a plan of essential components of the second work station according to the embodiment of the invention.

As shown in FIG. 13, a plurality of tape guide members 40 each containing a tape guide slit 40a are projectively set to those positions of the table 31 corresponding to the holding unit 13.

Next, structural details of those work stations 21 through 27 are described below. As shown in FIG. 1, the first work station 21 is furnished with a bending unit 41 which bends the fourth pin 4 of a lead-wire member B cut off by the cutting unit 14.

The bending unit 41 supports the first, second, and the third pins in the upward direction except for the fourth pin. The bending unit 41 is furnished with an air cylinder which solely depresses the fourth pin 4 downwardly.

The second work station is furnished with a welding unit 42 which executes a spot-welding operation in order to connect a conductive foil tape D drawn out of a reel (not shown) to the second pin 2 of the lead-wire member B and a cutting unit 43 which cuts off the conductive foil tape at a predetermined position.

Figure 14:
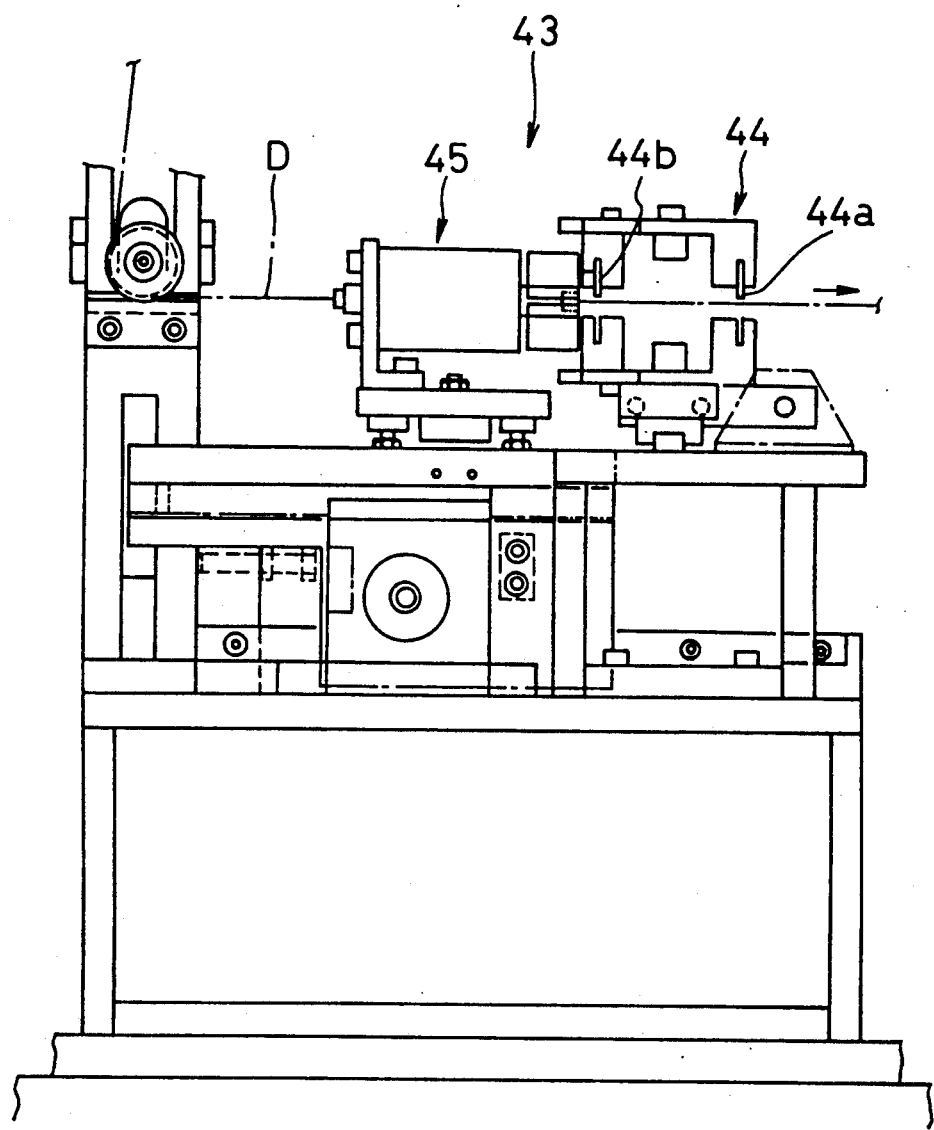
FIG. 14 is a cross-sectional view of the second work station shown in FIG. 13 across the arrowed line H through H.

As shown in FIGS. 13 and 14, the cutting unit 43 is furnished with the following; a tape chuck 44 which retains the conductive foil tape D drawn out of a reel (not shown) for a predetermined length; a pair of blades 44a and 44b which are provided for the tape chuck 44; and a conveying unit 45 which conveys the tape chuck 44 onto the lead-wire member B retained between a pair of the upper and bottom-side holding claws 35 and 34 of the holding unit 13 on the table 31.

The welding unit 42 executes a spot welding operation in order to joint the conductive foil tape D with the second pin 2 after conveying the conductive foil tape D onto the lead-wire member B via the conveying unit 45. Although not being illustrated, electrodes of the welding unit 42 can freely approach and leave the conductive foil tape D in the vertical direction.

The third work station 23 is furnished with a welding unit 46 which also executes a spot welding operation in order to joint the conductive foil tape D drawn out of a reel with the first pin other than those pin which were previously welded while activating the second work station 22 and a cutting unit 47 which cuts off the conductive foil tape D at a predetermined position. The latter welding unit 46 and cutting unit 47 are respectively of the structure identical to those which were previously described in reference to the second work station 22, and thus, further description of these is deleted here.

The fourth work station 24 is furnished with a core-adhering unit 48 which permits core material made of polyester tape for example to adhere itself to an end of the lead-wire member B after drawing out the core material coated with adhesive agent from a reel and cutting it into a predetermined length. After cutting the core material drawn out of a reel into a predetermined length, the core-material adhering unit 48 brings the cut-off core material into contact with the first, second, and the third pins 1, 2, and 3, in the upward direction before eventually adhering the core material to the bottom surfaces of those pins 1 through 3. This in turn permits these component pins to properly maintain own shape. The core-material adhering unit 48 is furnished with a cutting unit which has the structure identical to that is provided for the cutting unit available for the second work station 22 and a pressing unit like an air cylinder for example.

The fifth work station 25 is furnished with a correction unit 51 which straightens the fourth pin 4 of the lead-wire member B having an end being wrapped with a conductive foil tape by effect of the rotation of the holding unit 13. As shown in FIG. 15 for example, the correction unit 51 is provided with an engaging unit 53 at the tip of a rod 52a of an air cylinder 52 in order to raise the fourth pin 4. Furthermore, as shown in FIG. 1, the fifth work station 25 is furnished with a welding unit 54 which executes a spot-welding operation in order to joint the conductive foil tape previously welded to the first pin with the fourth pin 4.

The sixth work station 26 is furnished with a heat press 55 which thermally presses the lead-wire member B having an end being wrapped with an insulation (sealin) tape by effect of the rotation of the holding unit 13 and a cutting unit 56 which cuts off the insulation tape into a predetermined length.

The seventh work station 27 is furnished with a delivery unit 57 which receives those substantially completed electronic parts (i.e., those lead-wire members B) and then delivers these parts to a heat press 17 before treating them with further processing operations.

The first and seventh work stations 21 and 27 are respectively furnished with a depressing unit (not shown) which depresses an end of the top-side holding claw 36 of the holding unit 13 in resistance against the force energized by a spring means so that the top and bottom holding claws 35 and 34 can alternately be released.

Next, the method of manufacturing a noise filter substantially making up an electronic part is described below.

Figure 5A:
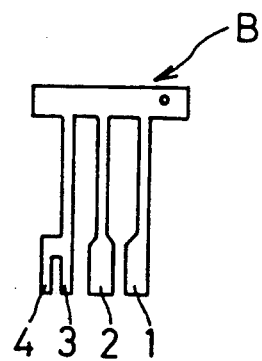
FIG. 5A and 5B respectively illustrate a plan and a front view showing the electronic-part manufacturing process according to an embodiment of the invention.
Figure 5B:
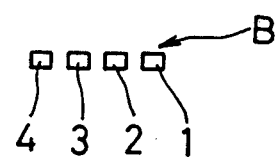

Initially, as shown in FIG. 5A and 5B, the cutting unit 14 cuts off the lead frame C drawn out of a reel (not shown) into lead-wire members B. Next, each of these lead-wire members B is sequentially delivered to the holding unit 13 on the turn table 11 placed on the first work station 21 via the delivery unit 15 and the conveying unit 16.

Figure 6A:
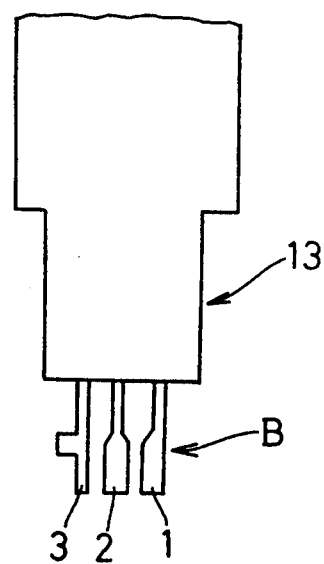
FIG. 6A and 6B respectively illustrate a plan and a front view showing further manufacturing process according to the invention.
Figure 6B:
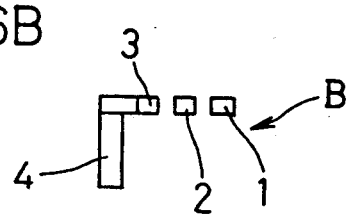

Next, as shown in FIG. 6A and 6B, the first work station 21 activates operation of the bending unit 41 in order to bend the fourth pin 4 of the lead-wire member B by substantially 90 degrees. Next, the turn table 11 is rotated by a predetermined angle so that the holding unit 13 can be shifted to the second work station 22.

Figure 7A:
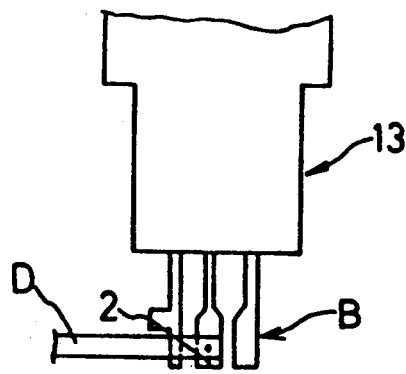
FIG. 7A and 7B respectively illustrate a plan and a front view showing further manufacturing process according to the invention.
Figure 7B:
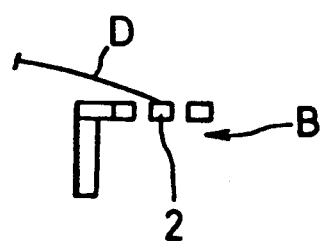

Then, as shown in FIG. 7A and 7B, when the second work station 22 activates operation, the conductive foil tape D drawn out of a reel (not shown) is spot-welded against the second pin 2 of the delivered lead-wire member B, and then the conductive foil tape D is cut off into a predetermined length by the cutting unit 43. Next, the turn table 11 is rotated by a predetermined angle so that the holding unit 13 can be shifted to the third work station 23.

Figure 8A:
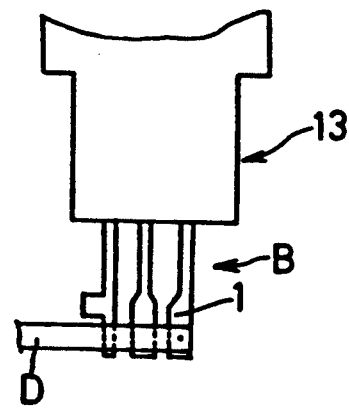
FIG. 8A and 8B respectively illustrate a plan and a front view showing further manufacturing process according to the invention.
Figure 8B:
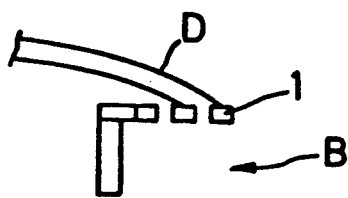

As shown in FIG. 8A and 8B, as was done by the second work station 22, the third work station 23 also executes a spot welding operation to joint the conductive foil tape D with the first pin 1 of the delivered lead-wire member B, and then, the conductive foil tape D is cut into a predetermined length by the cutting unit 47. Next, the turn table 11 is rotated by a predetermined angle in order to shift the holding unit 13 to the fourth work station 24.

Figure 9A:
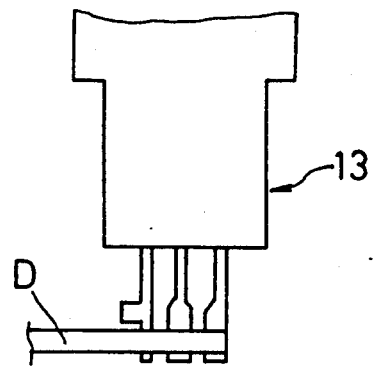
FIG. 9A and 9B respectively illustrate a plan and a front view showing further manufacturing process according to the invention.
Figure 9B:
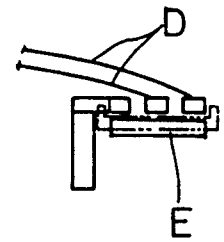

When the fourth work station 24 activates operation, as shown in FIG. 9A and 9B, core material E coated with adhesive agent is drawn out of a reel (not shown) and then cut off into a predetermined length. Next, the core-adhering unit 48 adheres the cut-off core material E to the bottom surfaces of the first, second, and the third pins 1, 2, and 3 of the lead-wire member B. This permits the processed parts to properly retain own shape. It should be understood that adhesive agent is not always needed for jointing core material E, but instead, as indicated by assumptive lines shown in FIG. 9B, the core material E may be coupled with the bottom surface of the lead-wire member B.

Figure 10A:
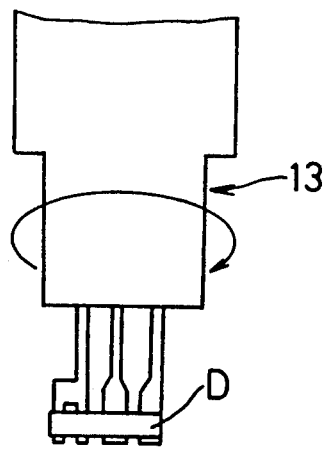
FIG. 10A and 10B respectively illustrate a plan and a front view showing further manufacturing process according to the invention.
Figure 10B:
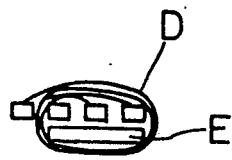
Figure 12:
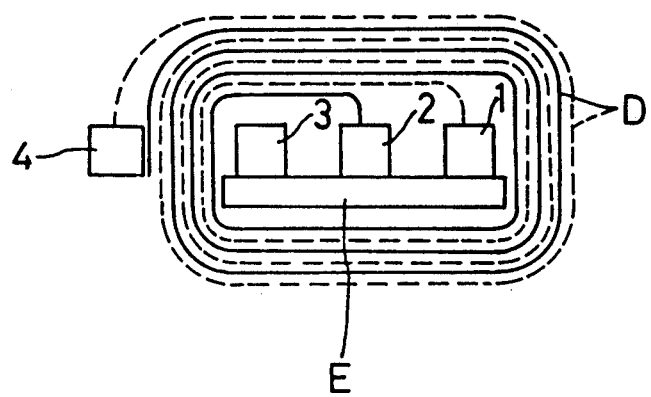
FIG. 12 is a schematically illustrated sectional view of an electronic part manufactured by the apparatus embodied by the invention.

Next, the turn table 11 is again rotated by a predetermined angle so that the holding unit 13 can be shifted to the fifth work station 25. When the fifth work station 25 activates operation, as shown in FIG. 10A and 10B, the holding unit 13 rotates itself to wind the conductive foil tape D, which was previously welded against the first and second pins 1 and 2, onto all the pins 1 through 3. Then, the correction unit 51 is operated in order to restore the fourth pin 4 to the initial horizontal posture. Next, an end of the conductive foil tape D welded against the first pin 1 is spot-welded against the fourth pin 4. FIG. 12 illustrates the sectional view of the workpieces as of the state just mentioned above.

Figure 11A:
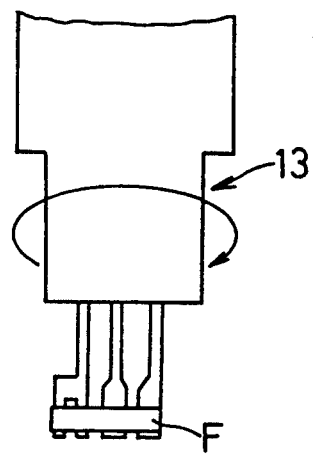
FIG. 11A and 11B respectively illustrate a plan and a front view showing further manufacturing process according to the invention.
Figure 11B:
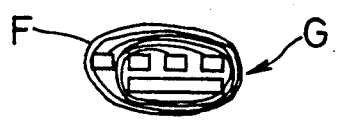

Next, the turn table 11 is again rotated by a predetermined angle to shift the holding unit 13 to the sixth work station 26. When the sixth work station 26 activates operation, as shown in FIG. 11A and 11B, in order to fully seal those pins 1 through 4, an insulation tape F is wound onto these pins 1 through 4 by several rounds. After thermally being pressed for adhesion by the pressing unit 55, the insulation tape F is cut off.

Next, the turn table 11 is again rotated by a predetermined angle to shift the holding unit 13 to the seventh work station 27. Next, the delivery unit 57 disengages the part G (which is virtually completed via those predetermined processes executed by the first through sixth work stations 21 through 26) from the holding unit 13 and then delivers it to the heat press 17.

The heat press 17 thermally presses the completed part G for a predetermined period of time under pressurized condition so that electrical constant of the completed part G can be stabilized. The heat press 17 has a proper length of operating domain compatible with the time needed for applying pressure and heat. The completed parts can move themselves in the heat press 17 synchronous with the intermittent drive cycle of the turn table 11. Although the effect of synchronization can also be held on while the operating components of the apparatus are continuously driven, the heat press 17 may also be driven independently.

Either the back surface in contact with the lead frame C or the both surfaces of the conductive foil tape D is or are coated with an insulation film. A notched domain is provided for such a location where the spot-welding is executed against a designated pin.

Alternatively, instead of using the branched lead wire 4 specifically made available for implementing the preceding embodiment of the invention, the apparatus according to the second aspect of the invention manufactures electronic parts by bending an external lead wire 3 among those three lead wires. Substantially, the second aspect of the invention embodies the apparatus furnished with the structure exactly identical to that is made available for the apparatus according to the first aspect of the invention, and therefore, description of the structure of this apparatus is deleted here.

Next, the method of manufacturing electronic parts executed by the apparatus according to the second aspect of the invention is summarized below.

Since the apparatus according to the second aspect of the invention incorporates those operating components exactly identical to those which are made available for implementing the first embodiment, those corresponding components are expressed by identical reference numerals.

First, when the first work station 21 activates operation, the bending unit 41 bends the third pin 3 by 90 degrees, where the third pin 3 is an external lead wire of the lead-wire member B.

Next, when the second work station 22 activates operation, initially, the conductive foil tape D drawn out of a reel (not shown) is welded against the second pin 2 of the lead-wire member B, and then cut into a predetermined length by the cutting unit 43.

As was done by the second work station 22, when the third work station 23 is activated, initially, the conductive foil tape D is welded against the first pin 1 of the leadwire member B, and then cut into a predetermined length by the cutting unit 47.

Next, when the fourth work station 24 is activated, core material E is drawn out of a reel (not shown) and then cut into a predetermined length. Next, the core-adhering unit 48 adheres the core material E to the bottom surfaces of the first and second pins of the lead-wire member B in order to Properly retain original shape of the processed parts.

Next, when the fifth work station 25 is activated, initially, the holding unit 13 rotates itself to wind the conductive foil tape D (connected to the first and second pins 1 and 2) onto the first and second pins 1 and 2. Then, the correction unit 51 restores the third pin 3 to the initial horizontal posture in parallel with the first and second pins.

Next, edges of the conductive foil tapes D welded to the first and second pins 1 and 2 in the third work station 23 are welded against the third pin 3.

Next, the sixth work station 26 is activated to cause an insulation tape F to be wound onto all the pins 1 through 3 by several rounds so that all the pins 1 through 3 can fully be sealed. The insulation tape F is then thermally pressed before being adhered to these pins 1 through 3, and then cut off.

After substantially being completed as a result of execution of those functional processes by the first through sixth work stations 21 through 26, those parts are then transferred to the seventh work station 27, where these parts are disengaged from the holding unit 13 by the delivery unit 57. Those released parts are then delivered to the heat press 17 to receive thermal treatment before eventually yielding complete electronic parts.

The above embodiments of the invention have respectively introduced a turn table 11 like an indexing table in order to intermittently transfer the lead-wire member B. Nevertheless, the invention also permits introduction of a chain for example to replace the turn table 11 so that the lead-wire members B can linearly be transferred between all the work stations.

Likewise, the above embodiments have respectively introduced an air cylinder to drive the bending unit 41, the core-adhering unit 48, and the correction unit 51. However, as a matter of course, the scope of the invention is not merely confined to the introduction of the air cylinder, but instead, drive mechanism may also be composed of a cam mechanism for example.

Likewise, the above description has solely referred to the provision of seven work stations to implement the above embodiments. Nevertheless, the scope of the invention is not merely defined to seven units of work stations as well.

What is claimed is:

1. An apparatus for manufacturing electronic parts wrapped with conductive foil, wherein, using a lead frame which is continuously provided with a number of individual-unit lead wire members each comprising three lead wires being disposed in parallel with each other by way of branching out another lead wire from a predetermined lead wire among said three lead wires, said apparatus manufactures electronic parts by arranging a conductive foil tape having one surface or both surfaces of said conductive foil being adhered with an insulation tape or a pair of insulation tapes to be wound on an end of said lead-wire member, wherein comprising the following:

a holding unit which freely holds and releases the other end of said lead-wire member and is rotatable by means of a rotating unit;

means for intermittently shifting said holding unit along a plurality of work stations each executing predetermined functional operation;

a bending unit which is provided for the first work station in order to bend a lead wire branched out from said individual-unit lead-wire member cut off by a cutting unit provided for said first work station;

a connection unit which is provided for a second work station in order to conductively connect the first conductive foil tape drawn out of a reel to a predetermined lead wire of said lead-wire member, and a cutting unit which cuts off said first conductive foil tape at a predetermined position;

another connection unit which is provided for a third work station in order to conductively connect a second conductive foil tape drawn out of a reel to those lead wires other than the one conductively connected by said second work station; and a cutting unit which cuts off said second conductive foil tape;

a correction unit which is provided for a fourth work station in order to straighten said lead wire branched out from said lead-wire member having an end being wrapped with said first and second conductive foil tapes by effect of the rotation of said holding unit; and a connection unit which conductively connects either of said conductive foil tapes which are conductively connected to either of said lead wires to said branched lead wire;

a pressing unit which is provided for a fifth work station in order to press said lead-wire member having an end being wrapped with an insulation tape by effect of the rotation of said holding unit; and a cutting unit which cuts off said insulation tape into a predetermined length; and a delivery unit which is provided for a sixth work station in order to receive said lead-wire member from said holding unit and then delivers it to the following processing line.

2. An apparatus for manufacturing electronic parts wrapped with conductive foil according to claim 1, further comprising means being provided between the third and fourth work stations in order to fix core material drawn out of a reel and cut into a predetermined length to an end of said lead-wire member.

3. An apparatus for manufacturing electronic parts wrapped with conductive foil, wherein, using a lead frame which is continuously provided with a number of individual-unit lead wire members each comprising three lead wires being disposed in parallel with each other, said apparatus manufactures electronic parts by wrapping an end of said lead-wire member with a conductive foil tape having one surface or both surfaces of said conductive foil being adhered with insulation film, wherein comprising the following:

a holding unit which freely holds and releases the other end of said lead-wire member and is rotatable by means of a rotating unit;

means for intermittently shifting said holding unit along a plurality of work stations each executing predetermined functional operation;

a bending unit which is provided for the first work station in order to bend an external wire of said individual-unit lead-wire member cut off by a cutting unit provided for said first work station;

a connection unit which is provided for a second work station in order to conductively connect a first conductive foil tape drawn out of a reel to a predetermined lead wire of said lead-wire member, and a cutting unit which cuts off said conductive foil tape at a predetermined position;

another connection unit which is provided for a third work station in order to conductively connect a second conductive foil tape drawing out of a reel to another lead wire other than the one which was conducively connected by the second work station; and a cutting unit which cuts off said conductive foil tape at a predetermined position;

a correction unit which is provided for a fourth work station in order to straighten said external lead wire of said lead-wire member having an end being wrapped with said first and second conductive foil tapes by effect of the rotation of said holding unit; and a connection unit which conductively joints a conductive foil tape connected to a lead wire with said straightened external lead wire;

a pressing unit which is provided for a fifth work station in order to press said lead-wire member having an end being wrapped with an insulation tape by effect of the rotation of said holding unit; and a cutting unit which cuts off said insulation tape into a predetermined length; and a delivery unit which is provided for a sixth work station in order to receive said lead-wire member from said holding unit before eventually delivering it to the following processing line.

4. An apparatus for manufacturing electronic parts wrapped with conductive foil according to claim 3, further comprising means which is provided between the third and fourth work stations in order to fix core material drawn out of a reel and cut into a predetermined length to an end of said lead-wire member.

* * * * *